United States Patent
Endo

(10) Patent No.: US 8,294,268 B2
(45) Date of Patent: Oct. 23, 2012

(54) RESIN COMPOSITION, PREPREG, LAMINATED BOARD, MULTILAYER PRINTED WIRING BOARD AND SEMICONDUCTOR DEVICE

(75) Inventor: Tadasuke Endo, Fujieda (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 326 days.

(21) Appl. No.: 12/594,879

(22) PCT Filed: Apr. 7, 2008

(86) PCT No.: PCT/JP2008/056878
§ 371 (c)(1),
(2), (4) Date: Oct. 6, 2009

(87) PCT Pub. No.: WO2008/126825
PCT Pub. Date: Oct. 23, 2008

(65) Prior Publication Data
US 2010/0044090 A1 Feb. 25, 2010

(30) Foreign Application Priority Data
Apr. 10, 2007 (JP) .................. 2007-103132

(51) Int. Cl.
H01L 23/14 (2006.01)
B32B 27/04 (2006.01)
B32B 27/38 (2006.01)
C08L 63/00 (2006.01)
C08K 5/08 (2006.01)

(52) U.S. Cl. .............. 257/746; 428/297.4; 428/413; 428/901; 523/440; 523/456

(58) Field of Classification Search .......... 523/440, 523/456; 428/297.4, 413, 901; 257/734, 257/746; 438/106
See application file for complete search history.

(56) References Cited

U.S. PATENT DOCUMENTS

| | | | |
|---|---|---|---|
| 6,372,351 B1 * | 4/2002 | Takemiya et al. | 428/416 |
| 2004/0170923 A1 | 9/2004 | Steinmann et al. | |
| 2009/0054587 A1 * | 2/2009 | Oshimi et al. | 524/612 |

FOREIGN PATENT DOCUMENTS

| | | |
|---|---|---|
| EP | 1 852 451 | 11/2007 |
| JP | 61-188412 | 8/1986 |
| JP | 5-21652 | 1/1993 |
| JP | 11-43547 | 2/1999 |
| JP | 11-172114 | 6/1999 |
| JP | 2000-72969 | 3/2000 |
| JP | 2001-36243 | 2/2001 |
| JP | 2001-123069 | 5/2001 |
| JP | 2001121534 A * | 5/2001 |
| JP | 2002-100843 | 4/2002 |
| JP | 2002-309085 | 10/2002 |
| JP | 2003-238768 | 8/2003 |
| JP | 2004-269649 | 9/2004 |
| JP | 2006-80544 | 3/2006 |
| JP | 2006-312716 | 11/2006 |
| JP | 2007-501318 | 1/2007 |
| JP | 2007009217 A * | 1/2007 |
| JP | 2007/046316 | 4/2007 |
| JP | 2008-133412 | 6/2008 |
| WO | 2006/090662 | 8/2006 |
| WO | 2006/098329 | 9/2006 |

OTHER PUBLICATIONS

Machine translation of JP 2001121534 A, provided by the JPO website (no date).*
Machine translation of JP 2007009217 A, provided by the JPO website (no date).*
Machine translation of JP 2000072969 A, provided by the JPO website (no date).*
International Search Report for International Application No. PCT/JP2008/056878 mailed Jun. 24, 2008.
Japanese Office Action issued on Jul. 24, 2012 for Application No. 2009-509339 w/ English language translation.

* cited by examiner

*Primary Examiner* — Michael J Feely
(74) *Attorney, Agent, or Firm* — Smith, Gambrell & Russell, LLP

(57) ABSTRACT

Provided are a resin composition whose storability is not reduced, a prepreg which uses the resin composition and which is uniformly colored, a laminated board, a multilayer printed wiring board having excellent results in reliability tests such as a thermal shock test and the like, and a semiconductor device. The resin composition is a resin composition for a multilayer printed wiring board, comprising (A) a novolac type epoxy resin, (B) a curing agent, (C) an inorganic filler, and (D) a colorant, wherein the exothermic peak temperature of the resin composition, as measured by DSC, is within ±5° C. of the exothermic peak temperature of a resin composition composed of (A) a novolac type epoxy resin, (B) a curing agent, and (C) an inorganic filler.

10 Claims, No Drawings

RESIN COMPOSITION, PREPREG, LAMINATED BOARD, MULTILAYER PRINTED WIRING BOARD AND SEMICONDUCTOR DEVICE

TECHNICAL FIELD

The present invention relates to a resin composition, a prepreg, a laminated board, a multilayer printed wiring board, and a semiconductor device. The present application claims the priority benefit of Japanese Patent Application No. 2007-103132 filed on Apr. 10, 2007, the content of which is hereby incorporated by reference.

BACKGROUND ART

In recent years, multilayer printed wiring boards, which are employed for uses such as a package for mounting semiconductors, based on a black tone, have become the mainstream. As one of the schemes for blackening the multilayer printed wiring board, there is known a scheme for combining colorants, for example, azoic metal complex black dyes, organic black dyes, or carbon pigment, such as carbon black, split black, with a resin composition such as a thermosetting resin configuring the multilayer printed wiring board.

However, there are problems in that the storability of resin compositions containing colorants is generally lowered, so that a prepreg cannot be manufactured, or the curing reaction is inhibited when the prepreg is being manufactured, so that insulation reliability or solder resistance/heat resistance is lowered when the multilayer printed wiring board using the manufactured prepreg is manufactured.

In addition, when the colorant content included in the resin composition is increased in order to manufacture a black multilayer printed wiring board without unevenness in external appearance, there is concern that inferiority may occur in a reliability test such as an insulation reliability test due to increase of ionic impurities.

Furthermore, a decomposition temperature or a sublimation temperature of the colorant is lowered according to the kinds of the colorant, so that there may be a problem that the laminated board including the colorant is blistered in a soldering heat resistance test.

[Patent Document 1] JP-A-2001-123069
[Patent Document 2] JP-A-2001-36243
[Patent Document 3] JP-A-2000-72969

DISCLOSURE OF THE INVENTION

Problem that the Invention is to Solve

The object of the present invention is to provide a resin composition whose storability is not reduced, a prepreg using the resin composition and which is uniformly colored, a laminated board, a multilayer printed wiring board having excellent results in reliability tests such as a thermal shock test and the like, and a semiconductor device.

Means for Solving the Problem

This object is attained by the present invention as described in (1) to (12) below.

(1) A first aspect of the present invention is a resin composition for a multilayer printed wiring board, comprising (A) a novolac type epoxy resin, (B) a curing agent, (C) an inorganic filler, and (D) a colorant, wherein the exothermic peak temperature of the resin composition, as measured by DSC, is within ±5° C. of the exothermic peak temperature of a resin composition composed of (A) a novolac type epoxy resin, (B) a curing agent, and (C) an inorganic filler.

(2) A second aspect of the present invention is the resin composition as described in (1) the first aspect, wherein the colorant (D) comprises at least one anthraquinone compound in its components.

(3) A third aspect of the present invention is the resin composition as described in (1) the first aspect or (2) the second aspect, wherein the content of the colorant (D) is from 0.1 to 4% by weight of the total amount of the resin composition.

(4) A fourth aspect of the present invention is the resin composition as described in any one of (1) the first aspect to (3) the third aspect, wherein the colorant (D) has a decrement in weight by sublimation or decomposition at 260° C. of 10% or less.

(5) A fifth aspect of the present invention is the resin composition as described in any one of (1) the first aspect to (5) the fifth aspect, wherein the inorganic filler (C) comprises at least one selected from the group consisting of magnesium hydroxide, aluminum hydroxide, silica, talc, calcined talc, and alumina.

(6) A sixth aspect of the present invention is the resin composition as described in any one of (1) the first aspect to (5) the fifth aspect, wherein the content of the inorganic filler (C) is from 20 to 80% by weight based on the total amount of the resin composition.

(7) A seventh aspect of the present invention is the resin composition as described in any one of (1) the first aspect to (6) the sixth aspect, which comprises cyanate and/or a prepolymer thereof.

(8) An eighth aspect of the present invention is the resin composition as described in (7) the seventh aspect, wherein the content of the cyanate resin is from 5 to 42% by weight based on the total amount of the resin composition.

(9) A ninth aspect of the present invention is a prepreg formed by impregnating the resin composition as described in any one of (1) the first aspect to (8) the eighth aspect into a base material.

(10) A tenth aspect of the present invention is a laminated board formed by molding one or more sheets of the prepreg as described in (9) the ninth aspect.

(11) An eleventh aspect of the present invention is a multilayer printed wiring board formed by using the prepreg as described in (9) the tenth aspect and/or the laminated board as described in (10) the ninth aspect.

(12) A twelfth aspect of the present invention is a semiconductor device formed by mounting a semiconductor element on the multilayer printed wiring board as described in (11) the eleventh aspect.

Advantage of the Invention

The resin composition of the present invention does not have reduced storability, a prepreg and a laminated board, each using the resin composition, are uniformly colored, and a multilayer printed wiring board and semiconductor device each have excellent results in reliability tests such as a thermal shock test and the like.

BEST MODE FOR CARRYING OUT THE INVENTION

The resin composition of the present invention is a resin composition for a multilayer printed wiring board, comprising (A) a novolac type epoxy resin, (B) a curing agent, (C) an inorganic filler, and (D) a colorant, wherein the exothermic peak temperature of the resin composition, as measured by DSC, is within ±5° C. of the exothermic peak temperature of a resin composition composed of (A) a novolac type epoxy resin, (B) a curing agent, and (C) an inorganic filler.

By using the resin composition of the present invention, a prepreg whose storability is not reduced and which is uniformly colored in appearance, a laminated board, a multilayer printed wiring board having excellent results in reliability tests such as a thermal shock test and the like, and a semiconductor device can be prepared.

Hereinbelow, the resin composition of the present invention will be described.

The novolac type epoxy resin (A) used in the present invention is not particularly limited, and examples thereof include a phenol novolac type epoxy resin, a cresol novolac type epoxy resin, a biphenylaralkyl type novolac epoxy resin, a naphthalene aralkyl type novolac epoxy resin, a dicyclopentadiene type novolac epoxy resin, and the like. These may be used singly or in combination of two or more kinds of those having different weight average molecular weights, or one or two or more kinds thereof and a prepolymer thereof may be used in combination. Among these, a novolac type epoxy having a methylene bond, such as a biphenylaralkyl type novolac epoxy resin, a naphthalene aralkyl type novolac epoxy resin, and the like is preferred from the viewpoint that it is excellent in heat resistance, flame retardancy, and water-absorptivity, and in particular, a biphenylaralkyl type novolac epoxy resin is more preferred. By this, the solder heat resistance after humidification and the flame retardancy can be improved.

The biphenylaralkyl type novolac epoxy resin refers to an epoxy resin having one or more biphenylalkylene groups in the repeating unit. Examples thereof include a xylylene type epoxy resin, a biphenyldimethylene type epoxy resin, and the like. Among these, a biphenyldimethylene type epoxy resin is preferred. The biphenyldimethylene type epoxy resin can be represented, for example, by the formula (I).

[Chemical Formula 1]

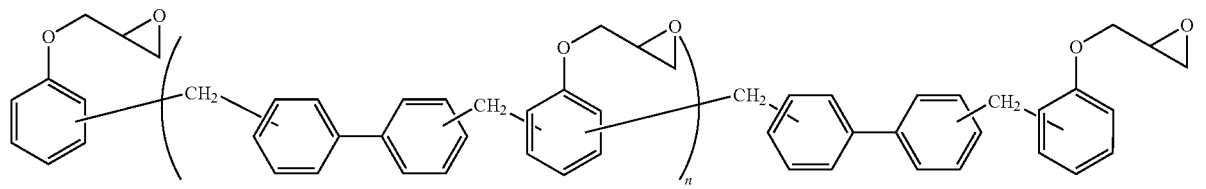

(1)

(wherein n is an arbitrary integer).

The average repeating unit, n, of the biphenyldimethylene type epoxy resin represented by the formula (1) is not particularly limited, but it is preferably from 1 to 10, and particularly preferably from 2 to 5. If the average repeating unit, n, is less than the lower limit, the biphenyldimethylene type epoxy resin is easily crystallized and its solubility in a widely used solvent is relatively lowered, whereby it becomes difficult to handle the resin in some cases. Further, if the average repeating unit, n, is more than the upper limit, the fluidity of the resin is reduced and molding failure or the like is caused in some cases.

The content of the novolac type epoxy resin (A) is not particularly limited, but it is preferably from 1 to 65% by weight, and particularly preferably from 5 to 40% by weight, based on the total amount of the first resin composition. If the content is less than the lower limit, the humidity resistance of the obtained product is reduced in some cases, whereas if it is more than the upper limit, the heat resistance is reduced in some cases.

The weight average molecular weight of the novolac type epoxy resin (A) is not particularly limited, but the weight average molecular weight is preferably from $5.0 \times 10^2$ to $2.0 \times 10^4$, and particularly preferably from $8.0 \times 10^2$ to $1.5 \times 10^4$. If the weight average molecular weight is less than the lower limit, tackiness occurs in the prepreg in some cases, whereas if it is more than the upper limit, the impregnating property into a base material is reduced in the preparation of the prepreg, and thus it is impossible to obtain a uniform product in some cases.

The weight average molecular weight of the epoxy resin can be measured, for example, by GPC (gel permeation chromatography, standard material: in terms of polystyrene).

Furthermore, the resin composition preferably comprises an inorganic filler. By this, it is possible to obtain sufficient strength even with a thin (thickness of 0.4 mm or less) laminated board. Further, the low thermal expansion of the laminated board can also be improved.

The curing agent (B) used in the present invention may use a compound which reacts with an epoxy group of the novolac type epoxy resin (A) such as a phenol resin and the like, or a curing accelerator which promotes the reaction between epoxy groups, such as imidazole.

The phenol resin is not particularly limited, but examples thereof include novolac type phenol resins such as a phenol novolac resin, a cresol novolac resin, a bisphenol A novolac resin, an aryl alkylene type novolac resin, and the like, a resol type phenol resin such as a non-modified resol phenol resin, an oil-modified resol phenol resin obtained by modification of tung oil, linseed oil, walnut oil, etc., and the like. These may be used singly or in combination of two or more kinds of those having different weight average molecular weights, or one or two or more kinds thereof and a prepolymer thereof may be used in combination. Among these, an aryl alkylene type phenol resin is preferred. By this, the solder heat resistance after humidification can be further improved.

The curing agent is not particularly limited, but examples thereof include organometallic salts such as zinc naphthenate, cobalt naphthenate, tin octylate, cobalt octylate, cobalt (II) bisacetylacetonate, cobalt (III) trisacetylacetonate, and the like, tertiary amines such as triethylamine, tributylamine, diazabicyclo[2,2,2]octane, and the like; imidazoles such as 2-methylimidazole, 2-phenylimidazole, 2-phenyl-4-methylimidazole, 2-ethyl-4-ethylimidazole, 1-benzyl-2-methylimidazole, 1-benzyl-2-phenylimidazole, 2-undecylimidazole, 1-cyanoethyl-2-ethyl-4-methylimidazole, 1-cyanoethyl-2-undecylimidazole, 2-phenyl-4-methyl-5-hydroxyimidazole, 2-phenyl-4,5-dihydroxyimidazole, 2,3-dihydro-1H-pyrrolo[1,2-a]benzimidazole, and the like, phenolic compounds such as phenol, bisphenol A, nonylphenol, and the like, organic acids such as acetic acid, benzoic acid, salicylic acid, paratolulensulfonic acid, and the like, or a mixture thereof. These may be used singly including a derivative thereof, or in combination of two or more kinds thereof including a derivative thereof.

The amount of the curing agent is not particularly limited, but in the case of using organometallic salts or imidazoles as the curing agent, the amount is preferably from 0.05 to 4% by weight, and more preferably from 0.1 to 2% by weight, based on the total amount of the resin composition. Further, in the case of using phenolic compounds, organic acids, or the like as the curing agent, the amount is preferably from 3 to 40% by weight, and more preferably from 5 to 25% by weight, based on the total amount of the resin composition. If the content is less than the lower limit, there occurs a problem in that it becomes difficult for the curing reaction of the resin to be fully completed in some cases, whereas if the content is more than the upper limit, there occur problems in that the molding failure occurs when a laminated board is prepared by molding the prepreg, or the reduction of the storability of the prepreg also occurs.

The inorganic filler (C) used in the present invention is not particularly limited, but examples thereof include silicates such as talc, calcined talc, calcined clay, uncalcined clay, mica, glass, and the like, oxides such as titanium oxide, alumina, silica, fused silica, and the like, carbonates such as calcium carbonate, magnesium carbonate, hydrotalcite, and the like, hydroxides such as aluminum hydroxide, magnesium hydroxide, calcium hydroxide, and the like, sulfates or sulfites such as barium sulfate, calcium sulfate, calcium sulfite, and the like, borates such as zinc borate, barium metaborate, aluminum borate, calcium borate, sodium borate, and the like, nitride such as aluminum nitride, boron nitride, silicon nitride, carbon nitride, and the like, titanates such as strontium titanate, barium titanate, and the like, and others. As the inorganic filler (C), these may be used singly or in combination of two or more kinds thereof. Among these, magnesium hydroxide, aluminum hydroxide, silica, fused silica, talc, calcined talc, or alumina is preferred, and fused silica is particularly preferred from the viewpoint that it is excellent in the low thermal expansion. The shape may be a crushed shape or a spherical shape, and in order to ensure the impregnation of the property into a fabric base, a use method adapted for the purpose, including a method of using a spherical silica so as to lower the melt viscosity of the resin composition, and others, is employed.

Furthermore, the inorganic filler (C) is not particularly limited, but an inorganic filler having an average particle diameter of a monodisperse may be used or an inorganic filler having an average particle diameter of a polydisperse may also be used. Further, the inorganic fillers having an average particle diameter of a monodisperse and/or the inorganic fillers having an average particle diameter of a polydisperse may be used singly or in combination of two or more kinds thereof.

The average particle diameter of the inorganic filler (C) is not particularly limited, but it is preferably from 0.005 to 10 μm, and particularly preferably from 0.01 to 2 μm. If the average particle diameter of the inorganic filler is less than the lower limit, the viscosity of a varnish increases, which thus has an effect on the workability in the preparation of a prepreg in some cases. Further, if it is more than the upper limit, a phenomenon such as settlement of an inorganic filler in the varnish, and the like occurs in some cases.

Furthermore, a spherical silica having an average particle diameter of 5.0 μm or less is preferred, and a spherical fused silica having an average particle diameter 0.01 to 2 μm is particularly preferred. By this, the filling property of the inorganic filler can be improved. Further, the average particle diameter can be measured, for example, by a particle size distribution measuring apparatus (manufactured by HORIBA, Ltd., LA-500).

The content of the inorganic filler (C) is not particularly limited, but it is preferably from 20 to 80% by weight, and particularly preferably from 30 to 75% by weight, based on the total amount of the resin composition. If the content is within the above-described range, particularly, the low thermal expansion and the low water-absorptivity can be realized.

The colorant (D) used in the present invention is one capable of coloring a resin composition, such as an organic pigment, an organic dye, and the like, which does not contribute to the curing of the resin composition.

In the case of using a colorant having a curing action, the storability of the resin composition is reduced, and thus a prepreg cannot be prepared in some cases. Further, in the case where the colorant is a cause of the interference with the curing, the curing reaction in the preparation of a prepreg is interfered with, and in the case where it is used in the preparation of a multilayer printed wiring board after preparation of the prepreg, the insulation reliability or the solder resistance/heat resistance of the multilayer printed wiring board is reduced in some cases.

Here, the curing accelerating action or the curing interference of the colorant can be assessed through an exothermic peak temperature by DSC measurement of the resin composition. It is preferable that the difference between the exothermic peak temperature of the resin composition of the present invention, as measured by DSC, and the exothermic peak temperature of a resin composition composed of (A) a novolac type epoxy resin, (B) a curing agent, and (C) an inorganic filler be within 5° C. If the difference between the exothermic peak temperatures is more than 5° C., the storability is reduced or the curability is reduced in some cases. Further, the curing exothermic peak temperature as measured by DSC can be determined in accordance with the method of JIS K7121.

The colorant (D) used in the present invention preferably comprises at least one anthraquinone compound, and specific examples thereof include Kayaset Black A-N (manufactured by Nippon Kayaku Co., Ltd.), Kayaset Black G (manufactured by Nippon Kayaku Co., Ltd.), and the like.

The content of the colorant (D) is not particularly limited, but it is preferably from 0.1 to 4% by weight, and more preferably from 0.3 to 1.2% by weight, based on the total amount of the resin composition. If it is less than the above-mentioned parts by weight, the appearance of the obtained multilayer printed wiring board has unevenness, whereas if it is more than the above-mentioned parts by weight, the curability is reduced in some cases.

The colorant (D) preferably has a decrease in weight by sublimation or decomposition at 260° C. of 10% or less. By this, the reduction in the weight of the laminated board can be lessened, and the solder resistance/heat resistance is excellent. Further, the reduction in weight at 260° C. can be confirmed by measuring the reduction in weight at 260° C. when the sample is heated at a rate of 10° C./minute, using TGA (thermal weight measuring apparatus).

It is preferable that the resin composition of the present invention further use a thermosetting resin (substantially not including halogen) in combination, in addition to the novolac type epoxy resin (A). Examples of the thermosetting resin include a resin having a triazine ring such as a urea resin, a melamine resin, and the like, an unsaturated polyester resin, a bismaleimide resin, a polyurethane resin, a diallylphthalate resin, a silicone resin, a resin having a benzoxazine ring, a cyanate resin, and the like.

These may be used singly or in combination of two or more kinds of those having different weight average molecular weights, or one or two or more kinds thereof and a prepolymer thereof may be used in combination.

Further, among these, a cyanate resin (including a prepolymer of the cyanate resin) is particularly preferred. By this, the thermal expansion coefficient of the prepreg can be lowered. Further, the electric characteristics (low dielectric constant and low dissipation factor), the machine strength, and the like of the prepreg are excellent.

The cyanate resin can be obtained, for example, by reacting a halogenated cyan compound with a phenol, and then, if necessary, converting it into a prepolymer by means of heating and the like. Specifically, examples of the resin include bisphenol type cyanate resins such as a novolac type cyanate resin, a bisphenol A type cyanate resin, a bisphenol E type cyanate resin, a tetramethyl bisphenol F type cyanate resin, and the like, and others. Among these, a novolac type cyanate resin is preferred. By this, the heat resistance is improved due to the increase in the crosslinking density, and the flame retardancy of the resin composition is improved. Particularly, this is considered to be caused by the fact that the novolac type cyanate resin has a high rate of benzene rings and is easily carbonated since it forms a triazine ring after the curing reaction. Further, even in the case of the prepreg having a thickness of 0.5 mm or less, the laminated board prepared by curing the prepreg has an excellent rigidity. Particularly, since the rigidity upon heating is excellent, the reliability upon mounting a semiconductor element is especially excellent.

As the novolac type cyanate resin, for example, one represented by the formula (2) can be used.

[Chemical Formula 2]

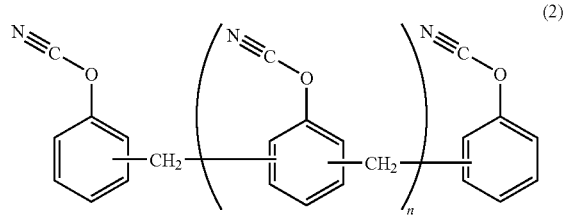

(wherein n is an arbitrary integer).

The average repeating unit, n, of the novolac type cyanate resin represented by the formula (2) is not particularly limited, but it is preferably from 1 to 10, and particularly preferably from 2 to 7. If the average repeating unit, n, is less than the lower limit, the heat resistance of the novolac type cyanate resin is reduced, and the low molecular weight components leave and volatilize upon heating in some cases. Further, if the average repeating unit, n, is more than the upper limit, the melt viscosity becomes too high, and thus the moldability of the prepreg is reduced in some cases.

The weight average molecular weight of the cyanate resin is not particularly limited, but the weight average molecular weight is preferably from $5.0 \times 10^2$ to $4.5 \times 10^3$, and particularly preferably from $6.0 \times 10^2$ to $3.0 \times 10^3$. If the weight average molecular weight is less than the lower limit, tackiness occurs when a prepreg is prepared, and thus, when the prepregs are brought into contact with each other, they are adhered to each other and the transfer of the resin is generated in some cases. Further, if the weight average molecular weight is more than the upper limit, the reaction proceeds too rapidly, and thus, when a multilayer printed wiring board is prepared, the molding failure occurs and the peel strength between the insulating layers is reduced in some cases. The weight average molecular weight of the cyanate resin can be measured, for example, by GPC (gel permeation chromatography, standard material: in terms of polystyrene).

In addition, the cyanate resins are not particularly limited, but these may be used singly or in combination of two or more kinds of those having different weight average molecular weights, or one or two or more kinds thereof and a prepolymer thereof may be used in combination.

The content of the cyanate resin is not particularly limited, but it is preferably from 5 to 42% by weight, and particularly preferably from 10 to 40% by weight, based on the total amount of the resin composition. If the content is less than the lower limit, the thermal expansion rate becomes high in some cases, whereas if it is more than the upper limit, the humidity resistance is reduced in some cases.

The coupling agent is not particularly limited, but specifically, it is preferable to use at least one coupling agent selected from an epoxysilane coupling agent, a cationic silane coupling agent, an aminosilane coupling agent, a titanate-based coupling agent, and a silicone oil type coupling agent. By this, the wettability with the surface of the inorganic filler can be enhanced, which can further improve the heat resistance.

The amount of the coupling agent to be added is not particularly limited, but it is preferably from 0.05 to 3 parts by weight, and particularly preferably from 0.1 to 2 parts by weight, based on 100 parts by weight of the inorganic filler (C). If the content is less than the lower limit, the inorganic filler cannot be sufficiently coated, and thus the effect of improving the heat resistance is reduced in some cases, whereas if it is more than the upper limit, the reaction is affected, and thus, the bending strength or the like is reduced in some cases.

The resin composition of the present invention may be added, for example, with a component which has improved adhesion with a conductor layer. Examples of the component include a phenoxy resin, a polyvinyl alcohol-based resin, a coupling agent for improving adhesion with a conductor circuit, and the like, and among these, a phenoxy resin is particularly preferred from the viewpoint that the adhesion is excellent and the curing reaction rate is little affected. Examples of the phenoxy resin include a phenoxy resin having a bisphenol backbone, a phenoxy resin having a novolac backbone, a phenoxy resin having a naphthalene backbone, a phenoxy resin having a biphenyl backbone, and the like. Further, a phenoxy resin having a structure having a plurality of backbones can be used.

Furthermore, the resin composition of the present invention may be added with other additives such as an antifoaming agent, a labeling agent, a UV absorbent, a blowing agent, an antioxidant, a flame retarding agent, an ion trapping agent, and the like, in addition to the components, if necessary.

Next, the prepreg will be described.

The prepreg of the present invention is formed by impregnating the resin composition into a base material. By this, a prepreg suitable for the preparation of a printed wiring board which is excellent in various characteristics such as dielectric characteristics, mechanical or electrical connection reliability under high temperature/high humidity, and the like can be obtained.

The base material is not particularly limited, but examples thereof include glass fiber materials such as glass woven fabric, glass non-woven fabric, and the like; polyamide-based resin fibers such as a polyamide resin fiber, an aromatic polyamide resin fiber, a wholly aromatic polyamide resin fiber, and the like, polyester-based resin fibers such as a polyester resin fiber, an aromatic polyester resin fiber, a wholly aromatic polyester resin fiber, and the like, synthetic fiber materials composed of a woven or non-woven fabric having a polyimide resin fiber, a fluorine resin fiber, or the like as a main component, organic fiber materials having a kraft paper, a cotton linter paper, a mixed paper of a linter and a kraft pulp, or the like as a main component, and the like. Among these, a glass fiber material is preferred. By this, the strength and the water absorptivity of the prepreg can be improved. Further, the thermal expansion coefficient of the prepreg can be reduced.

Examples of the glass constituting the glass fiber material include E glass, C glass, A glass, S glass, D glass, NE glass, T glass, H glass, and the like. Among these, E glass or T glass is preferred. By this, the high modulus of elasticity (elasticity) of the glass fiber material can be attained, and the thermal expansion coefficient can also be reduced.

Examples of the method for impregnating the resin composition obtained in the present invention into a base material include a method of preparing a resin varnish using the resin composition of the present invention and dipping a base material into the resin varnish, a method of coating using various coaters, a method of ejecting using a spray, and other methods. Among these, a method of dipping a base material into the resin varnish is preferred. By this, the impregnating property of the resin composition into a fiber material can be improved. Further, in the case of dipping the fiber material in a resin varnish, conventional impregnation coating equipment can be used.

As the solvent used for the resin varnish, those exhibiting good solubility in the resin component of the resin composition are preferred, and a poor solvent may be used within a range not giving any adverse effect. Examples of the solvent exhibiting good solubility include acetone, methyl ethyl ketone, methyl isobutyl ketone, cyclohexanone, cyclopentanone, tetrahydrofuran, dimethylformamide, dimethylacetamide, dimethylsulfoxide, ethylene glycol, cellosolves, carbitols, and the like.

The solid content of the resin varnish is not particularly limited, but it is preferably from 50 to 80% by weight, and particularly preferably from 60 to 78% by weight, based on the solid content of the resin composition. By this, the impregnating property of the resin varnish into a fiber material can be further improved. A predetermined temperature for impregnating the resin composition into the fiber material is not particularly limited, but for example, drying at 90 to 220° C., or other temperatures can be conducted to obtain a prepreg.

Next, the laminated board will be described.

The laminated board according to the invention is formed by laminating at least one sheet or plural sheets of the prepregs. A metal foil is overlapped on each of both upper and lower surfaces so as to be heated and pressed, and thus the laminated board can be obtained. The heating is not particularly limited, but it is preferably 120 to 230° C., and more particularly, 150 to 210° C. In addition, the pressurization pressure is not particularly limited, but it is preferably 1 to 5 MPa, and more particularly, 2 to 4 MPa. Accordingly, it is possible to obtain the laminated board which is excellent in dielectric characteristics and mechanical and electrical connection reliability in a high temperature/high humidity environment.

The metal foil is made of, for example, copper and copper alloy, aluminum and aluminum alloy, silver and silver alloy, gold and gold alloy, zinc and zinc alloy, nickel and nickel alloy, tin and tin alloy, or iron and iron alloy.

Next, the multilayer printed wiring board will be described.

The multilayer printed wiring board can be manufactured using the laminated board. The manufacturing method is not particularly limited. For example, an opening is formed on a predetermined position of a copper clad laminated board having copper foils on both surfaces by a drill machine, and electroless plating is performed on both surfaces of the inner layer circuit board to electrically conduct both surfaces. Then, the copper foil is etched to form an inner layer circuit.

Further, the inner layer circuit portion may preferably use a circuit board obtained by performing a roughening process, such as a blackening process. In addition, the opening may be appropriately filled with a conductor paste or a resin paste.

Next, the prepreg according to the invention or the insulating resin sheet with a film is laminated so as to cover the inner layer circuit, and forms an insulating layer. The method of laminating the insulating resin sheet with a film is not particularly limited. However, methods of laminating the insulating resin sheet with a film using a vacuum press, an atmospheric pressure laminator, and a vacuum hot press laminator are preferable. Among them, the method of laminating the insulating resin sheet with a film using the vacuum hot press laminator is more preferable.

Then, the formed insulating resin layer is cured by heat. The curing temperature is not particularly limited. For example, the curing temperature is preferably in the range of 100° C. to 250° C., and more preferably, in the range of 150° C. to 200° C.

Next, the opening is provided on the insulating layer using a carbon dioxide laser apparatus. An outer layer circuit is formed on the insulating layer surface by electrolytic plating so as to electrically conduct the outer layer circuit and the inner layer circuit. Further, the outer circuit is provided with a connecting electrode portion for mounting a semiconductor element.

Then, a solder resist is formed on the outermost layer. Exposure and development is performed on the solder resist to expose the connecting electrode portion so as to be able to mount the semiconductor element. Nickel gold plating is performed on the laminated board to be cut in a predetermined size, so that the multilayer printed wiring board can be obtained.

EXAMPLES

Hereinbelow, the embodiments of the present invention will be described in detail with reference to Examples, but, without departing from its subject, the present invention is not limited to the following Examples.

Example 1

(1) Preparation of Resin Varnish 14.0 parts by weight of a biphenylaralkyl type novolac epoxy resin (manufactured by Nippon Kayaku Co., Ltd., NC-3000) as the epoxy resin (A), 10.8 parts by weight of a biphenyldimethylene type phenol resin (manufactured by Nippon Kayaku Co., Ltd., GPH-103) as the curing agent (B), and 24.6 parts by weight of a novolac type cyanate resin (manufactured by Lonza Japan Ltd., Primaset PT-30) were dissolved and dispersed in methyl ethyl ketone. Further, 49.8 parts by weight of a spherical fused silica (manufactured by Admatechs Co., Ltd. "SO-25R", average particle diameter 0.5 μm) as the inorganic filler (C), 0.2 part by weight of a coupling agent (manufactured by Nippon Unicar Company Limited, A187), and 0.6 part by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

(2) Preparation of Prepreg

The above-described resin varnish was impregnated into a glass woven fabric (thickness 94 μm, manufactured by Nitto Boseki Co., Ltd., WEA-2116) and dried in a heating furnace at 150° C. for 2 minutes to obtain a prepreg having a varnish solid content of about 50% by weight in the prepreg.

(3) Preparation of Laminated Board

An 18 μm copper foil was overlaid on both surfaces of the above-described prepreg, and the prepreg was molded under heating and pressurizing at a pressure of 4 MPa and a temperature of 200° C. for 2 hours to obtain a double-sided copper foil laminated board having a thickness of 0.1 mm.

Example 2

A prepreg and a laminated board were prepared in the same manner as in Example 1 except that a resin varnish was prepared in the following manner.
11.2 parts by weight of a biphenylaralkyl type novolac epoxy resin (manufactured by Nippon Kayaku Co., Ltd., NC-3000) as the epoxy resin (A), 8.6 parts by weight of a biphenyldimethylene type phenol resin (manufactured by Nippon Kayaku Co., Ltd., GPH-103) as the curing agent (B), and 19.6 parts by weight of a novolac type cyanate resin (manufactured by Lonza Japan Ltd., Primaset PT-30) were dissolved and dispersed in methyl ethyl ketone. Further, 59.7 parts by weight of a spherical fused silica (manufactured by Admatechs Co., Ltd. "SO-25R", average particle diameter 0.5 μm) as the inorganic filler (C), 0.3 part by weight of a coupling agent (manufactured by Nippon Unicar Company Limited, A187), and 0.6 part by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Example 3

A prepreg and a laminated board were prepared in the same manner as in Example 1 except that a resin varnish was prepared in the following manner.
14.0 parts by weight of a biphenylaralkyl type novolac epoxy resin (manufactured by Nippon Kayaku Co., Ltd., NC-3000) as the epoxy resin (A), 10.8 parts by weight of a biphenyldimethylene type phenol resin (manufactured by Nippon Kayaku Co., Ltd., GPH-103) as the curing agent (B), and 24.6 parts by weight of a novolac type cyanate resin (manufactured by Lonza Japan Ltd., Primaset PT-30) were dissolved and dispersed in methyl ethyl ketone. Further, 49.8 parts by weight of a spherical fused silica (manufactured by Admatechs Co., Ltd. "SO-25R", average particle diameter 0.5 μm) as the inorganic filler (C), 0.2 part by weight of a coupling agent (manufactured by Nippon Unicar Company Limited, A187), and 0.6 part by weight of an anthraquinone compound-containing dye (manufactured by Nippon Kayaku Co., Ltd., Kayaset Black G) as the colorant (D) were added thereto, followed by stirring for 10 minutes using a high-speed stirrer to prepare a resin varnish having a solid content of 50% by weight.

Example 4

A prepreg and a laminated board were prepared in the same manner as in Example 1 except that a resin varnish was prepared in the following manner.
11.2 parts by weight of a biphenylaralkyl type novolac epoxy resin (manufactured by Nippon Kayaku Co., Ltd., NC-3000) as the epoxy resin (A), 8.7 parts by weight of a biphenyldimethylene type phenol resin (manufactured by Nippon Kayaku Co., Ltd., GPH-103) as the curing agent (B), and 19.8 parts by weight of a novolac type cyanate resin (manufactured by Lonza Japan Ltd., Primaset PT-30) were dissolved and dispersed in methyl ethyl ketone. Further, 59.7 parts by weight of a spherical fused silica (manufactured by Admatechs Co., Ltd. "SO-25R", average particle diameter 0.5 μm) as the inorganic filler (C), 0.3 part by weight of a coupling agent (manufactured by Nippon Unicar Company Limited, A187), and 0.3 part by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Example 5

A prepreg and a laminated board were prepared in the same manner as in Example 1 except that a resin varnish was prepared in the following manner.
11.0 parts by weight of a biphenylaralkyl type novolac epoxy resin (manufactured by Nippon Kayaku Co., Ltd., NC-3000) as the epoxy resin (A), 8.4 parts by weight of a biphenyldimethylene type phenol resin (manufactured by Nippon Kayaku Co., Ltd., GPH-103) as the curing agent (B), and 19.4 parts by weight of a novolac type cyanate resin (manufactured by Lonza Japan Ltd., Primaset PT-30) were dissolved and dispersed in methyl ethyl ketone. Further, 59.7 parts by weight of a spherical fused silica (manufactured by Admatechs Co., Ltd. "SO-25R", average particle diameter 0.5 μm) as the inorganic filler (C), 0.3 part by weight of a coupling agent (manufactured by Nippon Unicar Company Limited, A187), and 1.2 parts by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Example 6

A prepreg and a laminated board were prepared in the same manner as in Example 1 except that a resin varnish was prepared in the following manner.
14.0 parts by weight of a biphenylaralkyl type novolac epoxy resin (manufactured by Nippon Kayaku Co., Ltd., NC-3000) as the epoxy resin (A), 10.8 parts by weight of a biphenyldimethylene type phenol resin (manufactured by Nippon Kayaku Co., Ltd., GPH-103) as the curing agent (B), and 24.6 parts by weight of a novolac type cyanate resin (manufactured by Lonza Japan Ltd., Primaset PT-30) were dissolved and dispersed in methyl ethyl ketone. Further, 49.8 parts by weight of calcined talc (manufactured by Fuji Talc Industrial Co., Ltd., ST-100) as the inorganic filler (C), 0.2 part by weight of a coupling agent (manufactured by Nippon Unicar Company Limited, A187), and 0.6 part by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Example 7

A prepreg and a laminated board were prepared in the same manner as in Example 1 except that a resin varnish was prepared in the following manner.

15.5 parts by weight of a biphenylaralkyl type novolac epoxy resin (manufactured by Nippon Kayaku Co., Ltd., NC-3000) as the epoxy resin (A), 11.9 parts by weight of a biphenyldimethylene type phenol resin (manufactured by Nippon Kayaku Co., Ltd., GPH-103) as the curing agent (B), and 42.0 parts by weight of a novolac type cyanate resin (manufactured by Lonza Japan Ltd., Primaset PT-30) were dissolved and dispersed in methyl ethyl ketone. Further, 29.8 parts by weight of a spherical fused silica (manufactured by Admatechs Co., Ltd. "SO-25R", average particle diameter 0.5 µm) as the inorganic filler (C), 0.2 part by weight of a coupling agent (manufactured by Nippon Unicar Company Limited, A187), and 0.6 part by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Example 8

A prepreg and a laminated board were prepared in the same manner as in Example 1 except that a resin varnish was prepared in the following manner.

10.7 parts by weight of a biphenylaralkyl type novolac epoxy resin (manufactured by Nippon Kayaku Co., Ltd., NC-3000) as the epoxy resin (A), 7.8 parts by weight of a biphenyldimethylene type phenol resin (manufactured by Nippon Kayaku Co., Ltd., GPH-103) as the curing agent (B), and 5.0 parts by weight of a novolac type cyanate resin (manufactured by Lonza Japan Ltd., Primaset PT-30) were dissolved and dispersed in methyl ethyl ketone. Further, 74.6 parts by weight of a spherical fused silica (manufactured by Admatechs Co., Ltd. "SO-25R", average particle diameter 0.5 µm) as the inorganic filler (C), 0.4 part by weight of a coupling agent (manufactured by Nippon Unicar Company Limited, A187), and 1.5 parts by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Example 9

A prepreg and a laminated board were prepared in the same manner as in Example 1 except that a resin varnish was prepared in the following manner.

27.9 parts by weight of a biphenylaralkyl type novolac epoxy resin (manufactured by Nippon Kayaku Co., Ltd., NC-3000) as the epoxy resin (A) and 21.6 parts by weight of a biphenyldimethylene type phenol resin (manufactured by Nippon Kayaku Co., Ltd., GPH-103) as the curing agent (B) were dissolved and dispersed in methyl ethyl ketone. Further, 49.8 parts by weight of a spherical fused silica (manufactured by Admatechs Co., Ltd. "SO-25R", average particle diameter 0.5 µm) as the inorganic filler (C), 0.2 part by weight of a coupling agent (manufactured by Nippon Unicar Company Limited, A187), and 0.5 part by weight of an anthraquinone compound-containing dye (manufactured by Nippon Kayaku Co., Ltd., Kayaset Black A-N) as the colorant (D) were added thereto, followed by stirring for 10 minutes using a high-speed stirrer to prepare a resin varnish having a solid content of 50% by weight.

Comparative Example 1

A prepreg and a laminated board were prepared in the same manner as in Example 1 except that a resin varnish was prepared in the following manner.

14.1 parts by weight of a biphenylaralkyl type novolac epoxy resin (manufactured by Nippon Kayaku Co., Ltd., NC-3000) as the epoxy resin (A), 10.9 parts by weight of a biphenyldimethylene type phenol resin (manufactured by Nippon Kayaku Co., Ltd., GPH-103) as the curing agent (B), and 25.0 parts by weight of a novolac type cyanate resin (manufactured by Lonza Japan Ltd., Primaset PT-30) were dissolved and dispersed in methyl ethyl ketone. Further, 49.8 parts by weight of a spherical fused silica (manufactured by Admatechs Co., Ltd. "SO-25R", average particle diameter 0.5 µm) as the inorganic filler (C) and 0.2 part by weight of a coupling agent (manufactured by Nippon Unicar Company Limited, A187) were added thereto, followed by stirring for 10 minutes using a high-speed stirrer to prepare a resin varnish having a solid content of 50% by weight.

Comparative Example 2

A prepreg and a laminated board were prepared in the same manner as in Example 1 except that a resin varnish was prepared in the following manner.

11.2 parts by weight of a biphenylaralkyl type novolac epoxy resin (manufactured by Nippon Kayaku Co., Ltd., NC-3000) as the epoxy resin (A), 8.6 parts by weight of a biphenyldimethylene type phenol resin (manufactured by Nippon Kayaku Co., Ltd., GPH-103) as the curing agent (B), and 19.6 parts by weight of a novolac type cyanate resin (manufactured by Lonza Japan Ltd., Primaset PT-30) were dissolved and dispersed in methyl ethyl ketone. Further, 59.7 parts by weight of a spherical fused silica (manufactured by Admatechs Co., Ltd. "SO-25R", average particle diameter 0.5 µm) as the inorganic filler (C), 0.3 part by weight of a coupling agent (manufactured by Nippon Unicar Company Limited, A187), and 0.6 part by weight of a colorant (manufactured by Chuo synthetic Chemical Co., Ltd., Sudan Black 141) were added thereto, followed by stirring for 10 minutes using a high-speed stirrer to prepare a resin varnish having a solid content of 50% by weight.

Comparative Example 3

A prepreg and a laminated board were prepared in the same manner as in Example 1 except that a resin varnish was prepared in the following manner.

11.2 parts by weight of a biphenylaralkyl type novolac epoxy resin (manufactured by Nippon Kayaku Co., Ltd., NC-3000) as the epoxy resin (A), 8.6 parts by weight of a biphenyldimethylene type phenol resin (manufactured by Nippon Kayaku Co., Ltd., GPH-103) as the curing agent (B), and 19.6 parts by weight of a novolac type cyanate resin (manufactured by Lonza Japan Ltd., Primaset PT-30) were dissolved and dispersed in methyl ethyl ketone. Further, 59.7 parts by weight of a spherical fused silica (manufactured by Admatechs Co., Ltd. "SO-25R", average particle diameter 0.5 μm) as the inorganic filler (C), 0.3 part by weight of a coupling agent (manufactured by Nippon Unicar Company Limited, A187), and 0.6 part by weight of a colorant (manufactured by Chuo synthetic Chemical Co., Ltd., Oil Black S) were added thereto, followed by stirring for 10 minutes using a high-speed stirrer to prepare a resin varnish having a solid content of 50% by weight. However, in Comparative Example 3, gelation occurred upon preparation of the varnish, and thereafter, a prepreg could not be prepared.

The following evaluations were carried out on the resin composition, the prepreg, and the laminated board, obtained in each of Examples and Comparative Examples. The evaluation contents were shown with the items. The obtained results are shown in Table 1.

1. DSC Exothermic Peak Temperature Difference of Resin Composition

After a resin varnish was produced, the resin varnish was applied on the PET (SFB-38 made by Mitsubishi Chemical Polyester Film Co., Ltd.), and then was dried at a temperature of 170° C., thereby manufacturing a resin film. The resin film was measured at a rate of temperature rise 10° C./min under a nitrogen stream using a differential scanning calorimeter DSC (which is made by Seiko Instruments Inc.). From the DSC measurement data, the curing exothermic peak temperature is calculated on the basis of the JISK7121 method.

In Table 1, the absolute values of the temperature difference in Comparative example 1, the Examples 1 to 9, and Comparative example 2 are shown. Further, in Comparative example 3, there was no measurement since the varnish was turned into a gel when it was adjusted.

2. Varnish Storability

After the varnish was combined, the varnish was left under environment of 25° C., and the laminated board was manufactured for 1 week. In addition, the obtained laminated board was cut by 50 mm square so as to obtain the samples. Then, the multilayer printed wiring board was etched by ¾ and subjected to the D-2/100 process. Then, the multilayer printed wiring board was immersed in a soldering bath at a

TABLE 1

| | | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| Formulation (parts by weight) | (A) Novolac type epoxy resin | Biphenylaralkylepoxy (NC-3000H) | 14.0 | 11.2 | 14.0 | 11.2 | 11.0 | 14.0 | 15.5 | 10.7 | 27.9 |
| | (B) Curing agent | Phenol resin (GPH-103) | 10.8 | 8.6 | 10.8 | 8.7 | 8.4 | 10.8 | 11.9 | 7.8 | 21.6 |
| | (C) Inorganic filler | Spherical fused silica (SO-25R) | 49.8 | 59.7 | 49.8 | 59.7 | 59.7 | | 29.8 | 74.6 | 49.8 |
| | | Calcined talc (ST-100) | | | | | | 49.8 | | | |
| | (D) Colorant | Kayaset Black A-N | 0.6 | 0.6 | | 0.3 | 1.2 | 0.6 | 0.6 | 1.5 | 0.5 |
| | | Kayaset Black G | | | 0.6 | | | | | | |
| | Thermosetting resin | Cyanate resin (PT-30) | 24.6 | 19.6 | 24.6 | 19.8 | 19.4 | 24.6 | 42.0 | 5.0 | |
| | Coupling agent | A187 | 0.2 | 0.3 | 0.2 | 0.3 | 0.3 | 0.2 | 0.2 | 0.4 | 0.2 |
| | Difference in DSC exothermic peak temperatures of resin composition | | 1 | 2 | 1 | 1 | 2 | 1 | 1 | 2 | 1 |
| | Varnish storability (week) | | >4 | >4 | >4 | >4 | >4 | >4 | >4 | >4 | >4 |
| | Observation of appearance of laminated board | L Value (Lab color coordinate system) | 31 | 30 | 30 | 36 | 24 | 31 | 32 | 35 | 31 |
| | | Density of color | ○ | ○ | ○ | ○ | ○ | ○ | ○ | ○ | ○ |
| | Decrease rate (%) in weight at 260° C. of organic dye used | | 1.5 | 1.5 | 4.4 | 1.5 | 1.5 | 1.5 | 1.5 | 1.5 | 1.5 |
| | Decrease rate (%) in Weight at 300° C. of laminated board | | 0.08 | 0.03 | 0.06 | 0.04 | 0.07 | 0.11 | 0.13 | 0.08 | 0.07 |
| | Solder heat resistance | | No Problem | No Problem | No Problem | No Problem | No Problem | No Problem | No Problem | No Problem | No Problem |

| | | | Comp. Ex. 1 | Comp. Ex. 2 | Comp. Ex. 3 |
|---|---|---|---|---|---|
| Formulation (parts by weight) | (A) Epoxy resin | Epoxy resin (NC-3000H) | 14.1 | 11.2 | 11.2 |
| | (B) Curing agent | Phenol resin (GPH-103) | 10.9 | 8.6 | 8.6 |
| | (C) Inorganic filler | Spherical fused silica (SO-25R) | 49.8 | 59.7 | 59.7 |
| | (D) Colorant | Sudan Black 141 | | 0.6 | |
| | | Oil Black S | | | 0.6 |
| | Thermosetting resin | Cyanate resin (PT-30) | 25.0 | 19.6 | 19.6 |
| | Coupling agent | A187 | 0.2 | 0.3 | 0.3 |
| | Difference in DSC exothermic peak temperatures of resin composition | | — | 19 | — |
| | Varnish storability (weeks) | | >4 | 2 | 0 |
| | Observation of appearance of laminated board | L Value (Lab color coordinate system) | 70 | 24 | Gelation in the combination of varnish |
| | | Density of color | ○ | ○ | |
| | Decrease rate (%) in weight at 260° C. of organic dye used | | — | 13.1 | |
| | Decrease rate (%) in Weight at 300° C. of laminated board | | 0.12 | 0.30 | |
| | Solder heat resistance | | No Problem | No Problem | |

* Average value of triple measurements temperature of 260° C. for 30 seconds, and it was observed whether swelling occurred. It was determined that a period until there was no swelling was a life state.

3. External Observation of Laminated Board

The obtained copper clad laminated board was etched, and it was visually confirmed whether there was contrasting density of color according to places. After visually confirming, when the contrasting density of color was not found, the symbol O was denoted, and when the contrasting density of color was found, the symbol x was denoted.

In addition, the etched laminated board was subjected to measurement of L value using a color-difference meter. As the L value becomes smaller, it shows that the laminated board is colored.

4. Weight Reduction Rate of Colorant at 260° C.

The used colorant was heated up to 450° C. according to a speed of 10° C./min using TG/DTA, and the weight change rate was measured at from 100° C. to 260° C.

5. Weight Reduction Rate of Laminated Board at 300° C.

The copper foil of the obtained laminated board was etched and heated up to 450° C. according to a speed of 10° C./min using TG/DTA, and the weight change rate was measured at from 100° C. to 300° C.

6. Soldering Heat Resistance

The obtained laminated board was cut by 50 mm square so as to obtain the samples. Then, the laminated board was etched by ¾ and subjected to the D-2/100 process. Then, the multilayer printed wiring board was immersed in a soldering bath at a temperature of 260° C. for 30 seconds, and it was observed whether swelling occurred.

Examples 1 to 9 show the prepreg and the laminated board, manufactured using the resin composition according to the invention, which were colored without unevenness. In addition, the exothermic peak temperature, measured by the DSC, of the resin composition according to Examples 1 to 9 was in the range of +5° C. of the exothermic peak temperature according to Comparative example 1 without the colorant, and the storability also was good. On the other hand, Comparative example 1 was an example in which the colorant was not used, so that the external appearance was not colored. In Comparative example 2, the exothermic peak temperature is equal to or more than 5° C., and the storability was lowered. Further, in Comparative example 2, the weight reduction rate of the used colorant exceeded 10% at 260° C., but the weight reduction rate became 0.30% at 300° C. in the laminated board. As a result, the weight reduction rate became greater than the level of Examples. There was no inferiority in soldering heat resistance, but when an additive amount of the colorant increases, there is concern that the inferiority may occur. In Comparative example 3, the catalytic activity of the colorant was strong, so that the colorant was turned into a gel when the varnish was being manufactured. Therefore, the prepreg and the multilayer printed wiring board were not able to be manufactured.

INDUSTRIAL APPLICABILITY

The resin composition of the present invention is excellent in storability, and can be usefully employed as an inner layer circuit board and an insulating layer, each constituting a multilayer printed wiring board.

The invention claimed is:

1. A resin composition for a multilayer printed wiring board, comprising:
   (A) a novolac type epoxy resin,
   (B) a curing agent,
   (C) an inorganic filler, and
   (D) a colorant,
   wherein the exothermic peak temperature of the resin composition, as measured by DSC, is within ±5° C. of the exothermic peak temperature of the same resin composition formulated without (D), and
   the colorant (D) comprises at least one anthraquinone compound in its components, and the content of the (D) colorant is from 0.1 to 4% by weight based on the total amount of the resin composition.

2. The resin composition as described in claim 1, wherein the (D) colorant has a decrease in weight by sublimation or decomposition at 260° C. of 10% or less.

3. The resin composition as described in claim 1, wherein the (C) inorganic filler comprises at least one selected from the group consisting of magnesium hydroxide, aluminum hydroxide, silica, talc, calcined talc, and alumina.

4. The resin composition as described in claim 1, wherein the content of the inorganic filler (C) is from 20 to 80% by weight based on the total amount of the resin composition.

5. The resin composition as described in claim 1, which comprises cyanate and/or a prepolymer thereof.

6. The resin composition as described in claim 5, wherein the content of the cyanate resin is from 5 to 42% by weight based on the total amount of the resin composition.

7. A prepreg formed by impregnating the resin composition as described in claim 1 into a base material.

8. A laminated board formed by molding one or more sheets of the prepreg as described in claim 7.

9. A multilayer printed wiring board formed by using the prepreg as described in claim 7.

10. A semiconductor device formed by mounting a semiconductor element on the multilayer printed wiring board as described in claim 9.

* * * * *